US007197416B2

(12) United States Patent
Adachi et al.

(10) Patent No.: US 7,197,416 B2
(45) Date of Patent: Mar. 27, 2007

(54) SUPPORTING CALIBRATION AND DIAGNOSTICS IN AN OPEN ARCHITECTURE TEST SYSTEM

(75) Inventors: Toshiaki Adachi, San Jose, CA (US); Ankan Pramanick, San Jose, CA (US); Mark Elston, Salinas, CA (US)

(73) Assignee: Advantest America R&D Center, Inc., Santa Clara, CA (US)

( * ) Notice: Subject to any disclaimer, the term of this patent is extended or adjusted under 35 U.S.C. 154(b) by 173 days.

(21) Appl. No.: 10/917,724

(22) Filed: Aug. 13, 2004

(65) Prior Publication Data

US 2005/0261855 A1   Nov. 24, 2005

Related U.S. Application Data

(60) Provisional application No. 60/573,577, filed on May 22, 2004.

(51) Int. Cl.
G01R 27/28 (2006.01)
(52) U.S. Cl. .................. 702/119; 702/90; 714/746; 714/768
(58) Field of Classification Search ............ 702/80, 702/81, 85, 108, 117, 118, 119, 120, 121, 702/122, 123, 183, 184, 186, 188; 714/724, 714/734, 738, 746, 768; 324/73.1
See application file for complete search history.

(56) References Cited

U.S. PATENT DOCUMENTS

| 4,807,161 | A |   | 2/1989  | Comfort et al. |        |
|-----------|---|---|---------|----------------|--------|
| 5,025,205 | A | * | 6/1991  | Mydill et al.  | 324/73.1|
| 5,262,716 | A | * | 11/1993 | Gregory et al. | 324/754|
| 5,488,573 | A |   | 1/1996  | Brown et al.   |        |
| 5,892,949 | A |   | 4/1999  | Noble          |        |
| 6,028,439 | A |   | 2/2000  | Arkin et al.   |        |
| 6,195,774 | B1|   | 2/2001  | Jacobson       |        |
| 6,405,364 | B1|   | 6/2002  | Bowman-Amuah   |        |
| 6,427,223 | B1|   | 7/2002  | Kim et al.     |        |

(Continued)

FOREIGN PATENT DOCUMENTS

| DE | 10031536 A1      | 1/2001 |
| WO | WO-2004/072669 A1 | 8/2004 |
| WO | WO-2004/072670 A1 | 8/2004 |

OTHER PUBLICATIONS

Chang, E. et al. (1998), "A Scalable Architecture for VLSI Test," IEEE, Proceedings International Test Conference 1998, Washington, DC. Paper 20.2, pp. 500-506.

(Continued)

Primary Examiner—Marc S. Hoff
Assistant Examiner—Mohamed Charioui
(74) Attorney, Agent, or Firm—Morrison & Foerster LLP

(57) ABSTRACT

A method for integrating test modules in a modular test system includes creating component categories for integrating vendor-supplied test modules and creating a calibration and diagnostics (C&D) framework for establishing a standard interface between the vendor-supplied test modules and the modular test system, where the C&D framework comprises interface classes communicating vendor-supplied module integration information. The method further includes receiving a vendor-supplied test module, retrieving module integration information from the vendor-supplied test module in accordance with the component categories, and integrating the vendor-supplied test module into the modular test system based on the module integration information using the C&D framework.

26 Claims, 6 Drawing Sheets

U.S. PATENT DOCUMENTS

| | | | |
|---|---|---|---|
| 6,601,018 | B1 | 7/2003 | Logan |
| 6,629,282 | B1* | 9/2003 | Sugamori et al. ............ 714/734 |
| 6,651,204 | B1* | 11/2003 | Rajsuman et al. ........... 714/738 |
| 2002/0073375 | A1 | 6/2002 | Hollander |
| 2003/0005375 | A1* | 1/2003 | Krech et al. ................ 714/724 |
| 2003/0217343 | A1 | 11/2003 | Rajsuman et al. |
| 2004/0225459 | A1* | 11/2004 | Krishnaswamy et al. ..... 702/57 |
| 2005/0022087 | A1 | 1/2005 | Pramanick et al. |
| 2005/0154551 | A1 | 7/2005 | Pramanick et al. |

OTHER PUBLICATIONS

Conti, D. R. (2002). "Mission Impossible? Open Architecture ATE," *IEEE, Proceedings International Test Conference 2002*, Washington, DC. Panel 5.1, p. 1207.

Evans, A.C. (1999). "Applications of Semiconductor Test Economics, and Multisite Testing to Lower Cost of Test," *IEEE, Proceedings International Test Conference 1999*, Washington, DC. Paper 5.2, pp. 113-123.

Mirizzi, D.J. et al. (1993). "Implementation of Parrellelsite Test on an 8-Bit Configurable Microcontroller," *IEEE, Proceedings International Test Conference 1993*, Washington, DC. Paper 8.3, pp. 226-235.

Perez, S.M. (2002). "The Consequences of an Open ATE Architecture," *IEEE, Proceedings International Test Conference 2002*, Washington, DC. Panel P5.4, p. 1210.

Schoettmer, U. et al. (1995). "Challenging the 'High Performance—High Cost' Paradigm in Test," *IEEE, Proceedings International Test Conference 1995*, Washington, DC. Paper 37.1, pp. 870-879.

Simpson, W.R. (1995). "Cutting the Cost of Test; the Value-added Way," *IEEE, Proceedings International Test Conference 1995*, Washington, DC. Paper 41.2, p. 921.

West, B.G. (2002). "Open ATE Architecture: Key Challenges," *IEEE, Proceedings International Test Conference 2002*, Washington, DC. Panel P5.6, p. 1212.

Fan, D. et al. (2003). "Case Study—Using STIL as Test Pattern Language," *NPTest, Inc. LLC*, ITC International Test Conference, 32:3, pp. 811-817.

Fan, D. et al. (2003). "Case Study Using STIL as Test Pattern Language," *NPTest, Inc. LLC, ITC International Test Conference*, Paper 32:3, pp. 811-817.

International Search Report mailed on Aug. 8, 2005 for PCT Application No. PCT/JP2005/009811 filed on May 23, 2005, 5 pages.

Perez, S.M. et al. (Jul. 16, 2003). "Open Architecture Test System: The New Frontier," *28th IEEE/CPMI/SEMI International Electronics Manufacturing Technology Symposium*, San Jose, CA, Jul. 16-18, 2003, pp. 211-214.

Portelli, B. et al. (May 22, 1989). "Demonstration of Avionics Module Exchangeability via Simulation (DAMES) Program Overview," *Proceedings of the IEEE 1989 Natl Aerospace and Elect. Conf. (NAECON 1989)*, Dayton, OH, vol. 2:660-667.

Rajsuman, R. (Jan. 30, 2004). "An Overview of the Open Architecture Test System," *Proceedings of the 2nd IEEE Intl Workshop on Elect. Design, Test, and Applications (Delta '04)*, pp. 1-6.

Semiconductor Test Consortium. "ATE Open Architecture Initiative," (Oct. 8, 2002). located at <http://www.semitest.org/site/News/News_Files/file_news2> last visited on Mar. 8, 2006, 12 pages.

\* cited by examiner

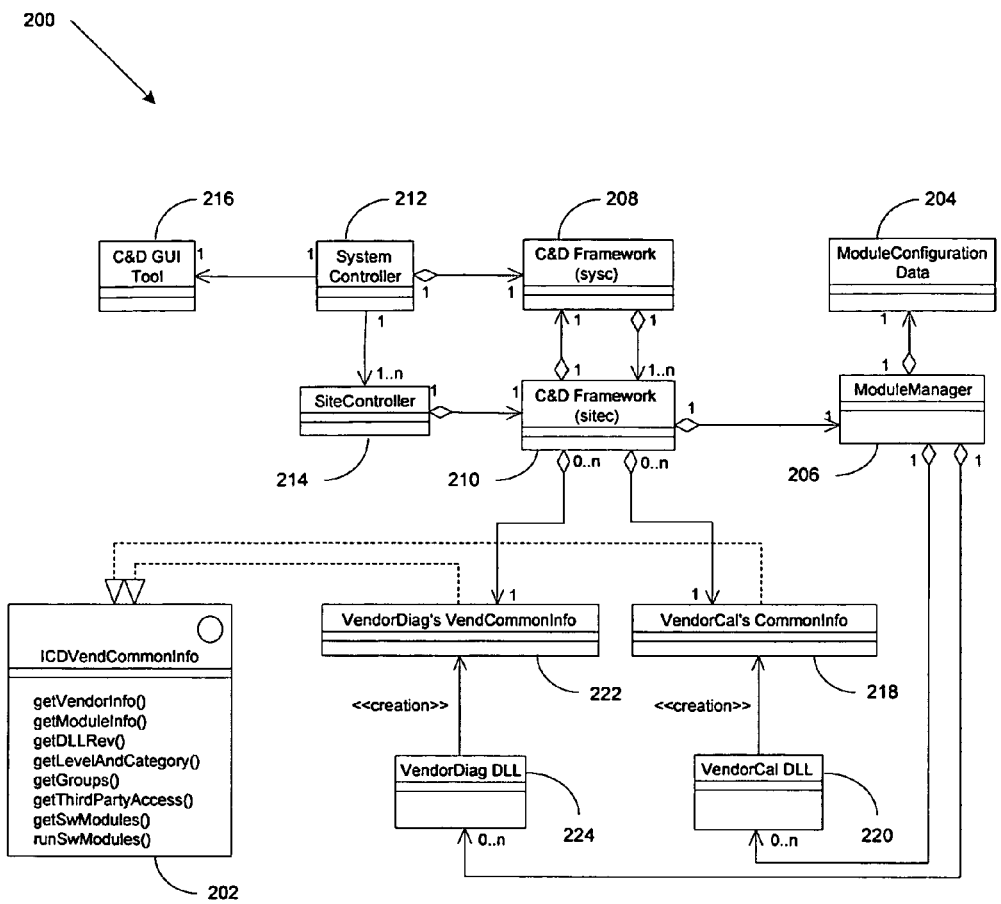
Figure 2a. Integration of Vendor Functionality into a Common Calibration and Diagnostic Framework

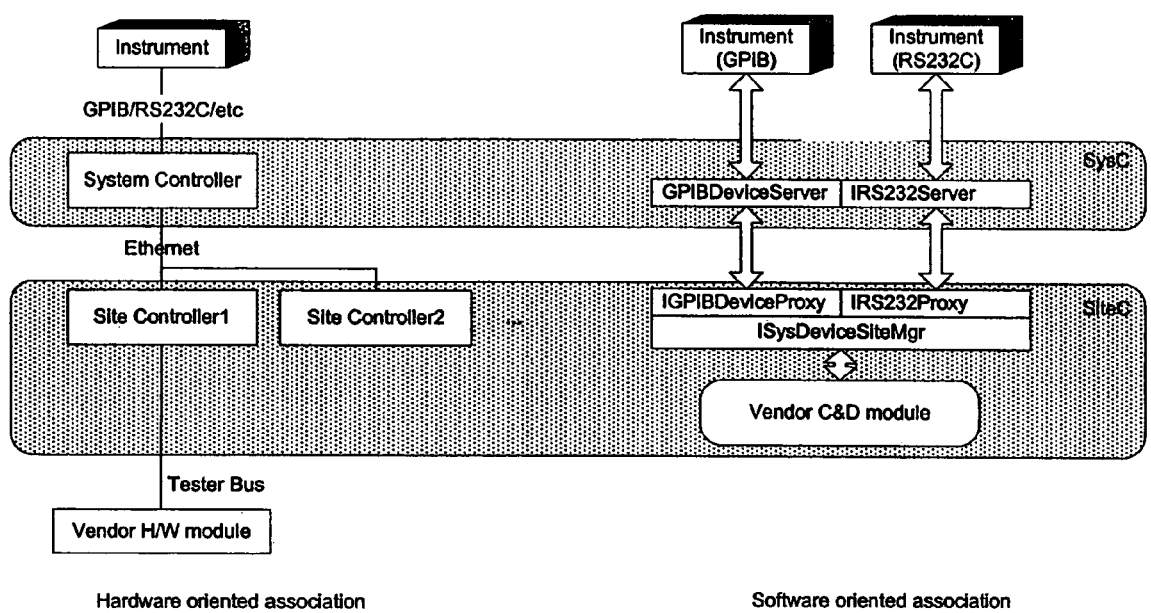
Figure 2b. Shared Instrument Access

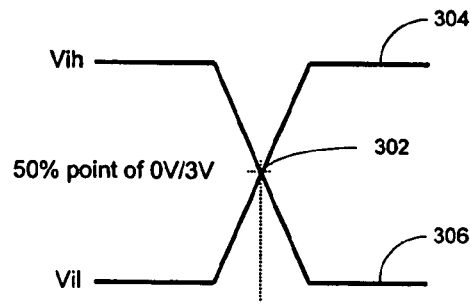
Figure 3a. Driver Timings Calibrated to a 50% Point
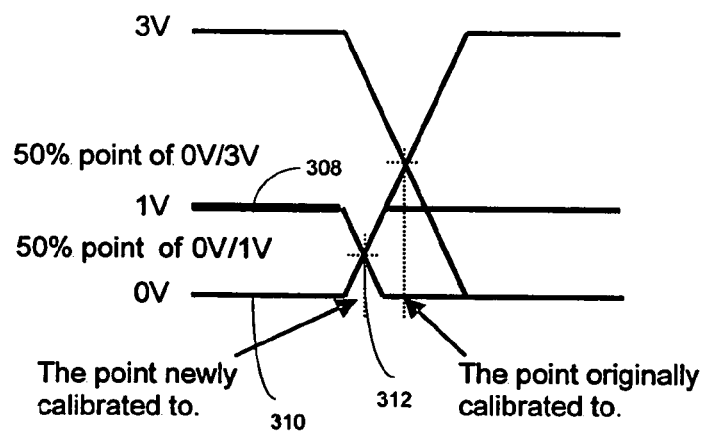
Figure 3b. Online Compensation of Driver Timing Calibration Data

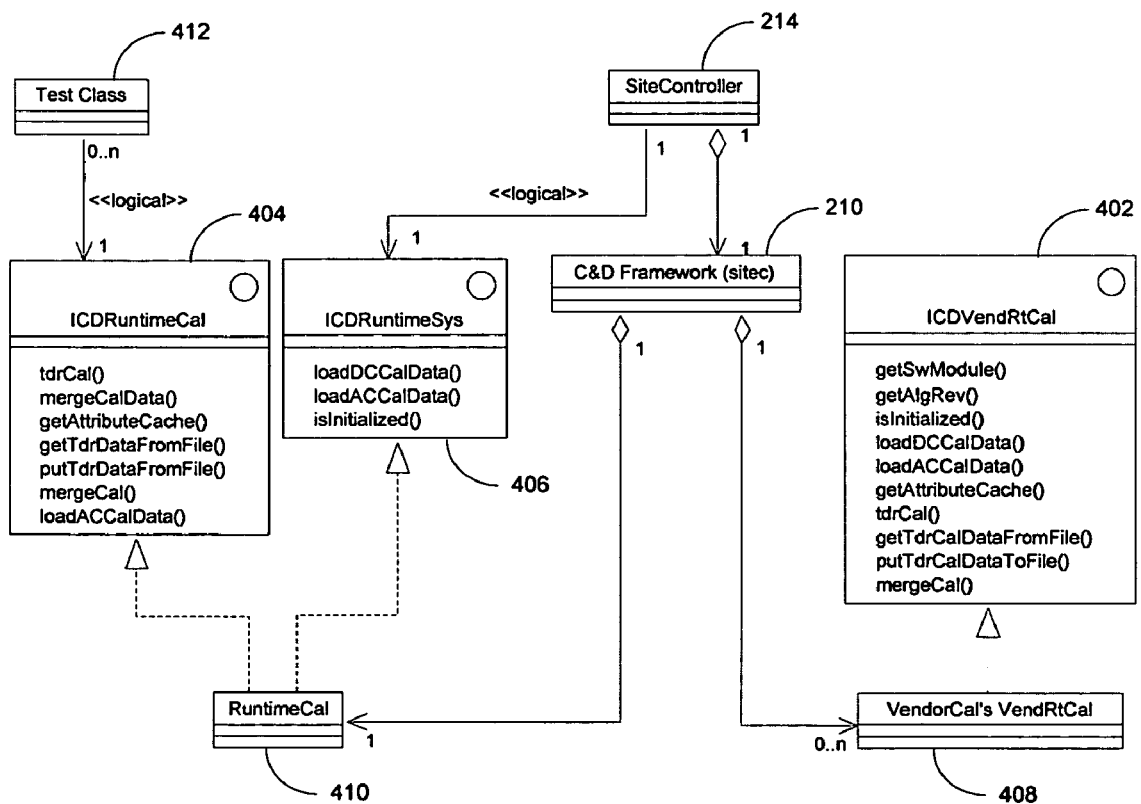
Figure 4. Runtime Calibration Framework

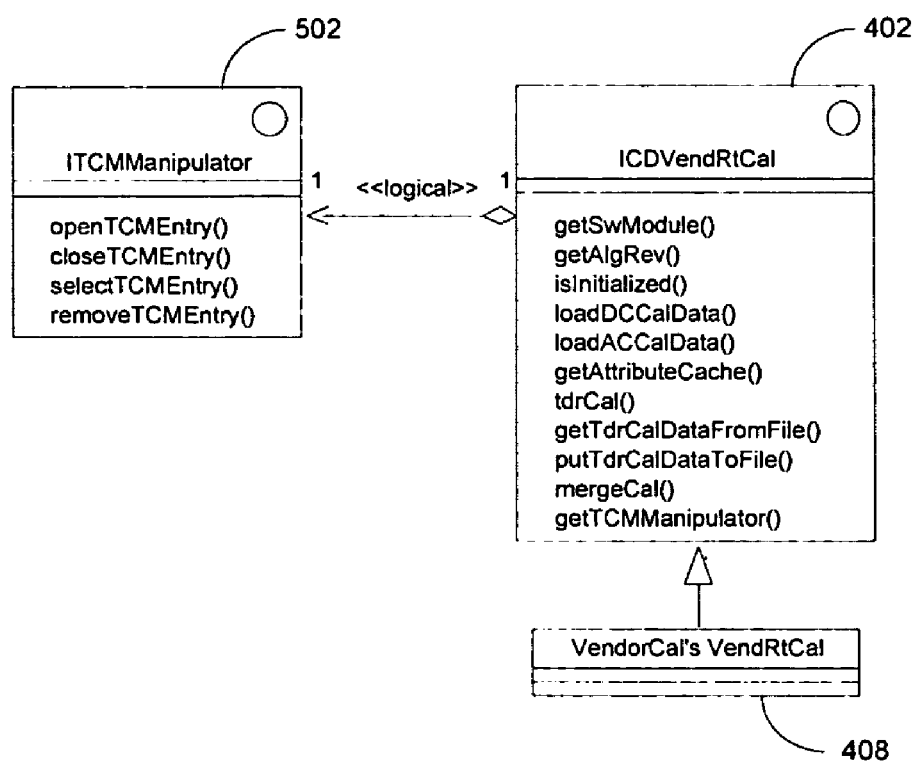
Figure 5. Test Condition Memory Manipulator Interface

SUPPORTING CALIBRATION AND DIAGNOSTICS IN AN OPEN ARCHITECTURE TEST SYSTEM

CROSS-REFERENCE TO RELATED APPLICATIONS

This application claims the benefit of application Ser. No. 60/573,577, "Software Development in an Open Architecture Test System," filed by Advantest Corporation on May 22, 2004, which is incorporated herein in its entirety by reference.

FIELD OF THE INVENTION

The present invention relates to the field of automated test equipment (ATE). In particular, the present invention relates to a method and system for supporting calibration and/or diagnostics in an open architecture test system.

BACKGROUND OF THE INVENTION

The increasing complexity of System-on-a-Chip (SOC) devices and the simultaneous demand for a reduction in the cost of chip testing has forced both integrated circuit (IC) manufacturers and tester vendors to rethink how IC testing should be performed. According to industry studies, without re-engineering the projected cost of testers will continue to rise dramatically in the near future.

A major reason for the high cost of test equipment is the specialized nature of conventional tester architecture. Each tester manufacturer has a number of tester platforms that are not only incompatible across companies such as Advantest, Teradyne and Agilent, but also incompatible across platforms within a company, such as the T3300, T5500 and T6600 series testers manufactured by Advantest. Because of these incompatibilities, each tester requires its own specialized hardware and software components, and these specialized hardware and software components cannot be used on other testers. In addition, a significant effort is required to port a test program from one tester to another, and to develop third party solutions. Even when a third party solution is developed for a platform, it cannot be ported or reused on a different platform. The translation process from one platform to another is generally complex and error prone, resulting in additional effort, time and increased test cost.

In such specialized tester architecture, tester software such as the operating system and test analysis tools/applications run on a host computer. Due to the dedicated nature of the architecture, all hardware and software remain in a fixed configuration for a given tester. To test a hardware device or an IC, a dedicated test program is developed that uses some or all of the tester capabilities to define the test data, signals, waveforms, and current and voltage levels, as well as to collect the device under test (DUT) response and to determine DUT pass/fail.

The testing of a wide variety of DUTs requires the hardware and software components of the tester system to exercise a wide range of functionalities and operations. During testing, different sets of vendor-supplied test modules may be utilized to support the wide range of functionalities, and the test system needs to be configured to support the vendor-supplied test modules and their corresponding calibration and/or diagnostics data in a plug-and-play manner. When a new vendor-supplied test module is utilized, calibration and/or diagnostics of the new test module may be required. In addition, the performance of a test module may be drifted outside the original calibrated range overtime, and the test module may need to be re-calibrated or re-diagnosed by the test system.

Hence, there is a need for open architecture test systems that can be configured with different test modules based on testing requirements. Specifically, there is a need for open architecture test systems that can be configured to use vendor-supplied calibration and/or diagnostics (C&D) information in a plug-and-play manner during runtime.

SUMMARY

The open architecture test system of an embodiment of the invention permits the integration of third party test modules. The hardware and software framework of the test system includes standard interfaces with which modules from different vendors may interact in a plug-and-play manner.

In one embodiment, a method for integrating test modules in a modular test system includes creating component categories for integrating vendor-supplied test modules and creating a calibration and diagnostics (C&D) framework for establishing a standard interface between the vendor-supplied test modules and the modular test system, where the C&D framework comprises interface classes communicating vendor-supplied module integration information. The method further includes receiving a vendor-supplied test module, retrieving module integration information from the vendor-supplied test module in accordance with the component categories, and integrating the vendor-supplied test module into the modular test system based on the module integration information using the C&D framework.

In another embodiment, a modular test system includes a system controller, at least one site controller coupled to the system controller, at least one vendor-supplied test module and its corresponding device under test (DUT), component categories for integrating vendor-supplied test modules, and a calibration and diagnostics (C&D) framework for establishing a standard interface between the vendor-supplied test modules and the modular test system, where the C&D framework comprises interface classes communicating vendor-supplied module integration information. The modular test system further includes means for receiving a vendor-supplied test module, means for retrieving module integration information from the vendor-supplied test module in accordance with the component categories, and means for integrating the vendor-supplied test module into the modular test system based on the module integration information using the C&D framework.

BRIEF DESCRIPTION OF THE DRAWINGS

The aforementioned features and advantages of the invention as well as additional features and advantages thereof will be more clearly understood hereinafter as a result of a detailed description of embodiments of the invention when taken in conjunction with the following drawings.

FIG. 2a illustrates a method for integrating vendor-supplied C&D information using a C&D framework according to an embodiment of the present invention.

FIG. 2b illustrates the scheme used by the test system for accessing shared instrument according to an embodiment of the present invention.

FIG. 3a illustrates a waveform of a digital function generator module that calibrates its driver timing according to an embodiment of the present invention.

FIG. 3b illustrates a waveform of online compensation of driver timing calibration data according to an embodiment of the present invention.

FIG. 4 illustrates the integration of vendor-specific calibration information into an open architecture tester framework during runtime according to an embodiment of the present invention.

FIG. 5 illustrates a method for implement a test condition memory according to an embodiment of the present invention.

Like numbers are used throughout the figures.

DESCRIPTION OF EMBODIMENTS

Figure 1:
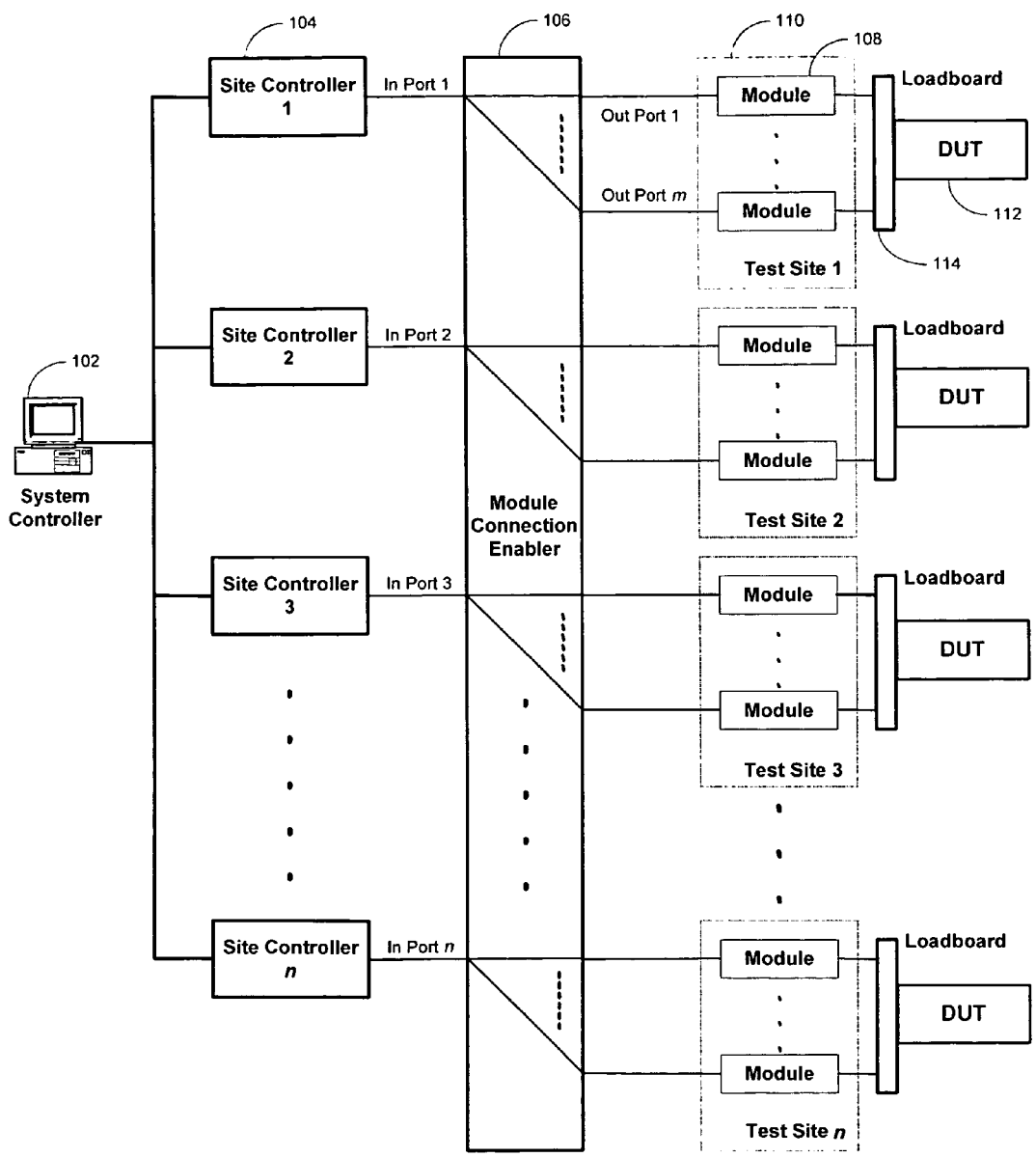
FIG. 1 illustrates an open architecture test system according to an embodiment of the present invention.

Methods and systems are provided for supporting calibration and/or diagnostics in an open architecture test system. The following description is presented to enable any person skilled in the art to make and use the invention. Descriptions of specific techniques and applications are provided only as examples. Various modifications and combinations to the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

FIG. 1 illustrates an open architecture test system according to an embodiment of the present invention. A system controller (SysC) 102 is coupled to multiple site controllers (SiteCs) 104. The system controller may also be coupled to a network to access associated files. Through a module connection enabler 106, each site controller is coupled to control one or more test modules 108 located at a test site 110. The module connection enabler 106 allows reconfiguration of connected hardware modules 108 and also serves as a bus for data transfer (for loading pattern data, gathering response data, providing control, etc.). In addition, through the module connection enabler, a module at one site can access a module at another site. The module connection enabler 106 allows different test sites to have the same or different module configurations. In other words, each test site may employ different numbers and types of modules. Possible hardware implementations include dedicated connections, switch connections, bus connections, ring connections, and star connections. The module connection enabler 106 may be implemented by a switch matrix, for example. Each test site 110 is associated with a DUT 112, which is connected to the modules of the corresponding site through a loadboard 114. In one embodiment, a single site controller may be connected to multiple DUT sites.

The system controller 102 serves as the overall system manager. It coordinates the site controller activities, manages system-level parallel test strategies, and additionally provides for handler/probe controls as well as system-level data-logging and error handling support. Depending on the operational setting, the system controller 102 can be deployed on a CPU that is separate from the operation of site controllers 104. Alternatively a common CPU may be shared by the system controller 102 and the site controllers 104. Similarly, each site controller 104 can be deployed on its own dedicated CPU (central processing unit), or as a separate process or thread within the same CPU.

The system architecture can be conceptually envisioned as the distributed system shown in FIG. 1 with the understanding that the individual system components could also be regarded as logical components of an integrated, monolithic system, and not necessarily as physical components of a distributed system.

According to an embodiment of the open architecture test system of the present invention, the plug-and-play or replaceable modules is facilitated by use of standard interfaces at both hardware and software levels. A tester operating system (TOS) allows a user to write test plan programs using a test plan programming language, to operate the test system in a way specific to a particular device under test (DUT). It also allows for the packaging of sequences of the test system operations commonly used in test plan programs as libraries. These libraries are sometimes referred to as test classes, test templates, and other names. Vendor-supplied test modules are likely to require calibration of measurement/response values as well as means for diagnosing problems. A calibration and diagnostics (C&D) framework within the TOS needs to be able to invoke these capabilities for any module by using a standard interface. In this way, the proper behavior may be invoked for each test module without requiring any vendor-specific knowledge on the part of the TOS. This approach simplifies the TOS design and encapsulates the vendor's implementation of the module-specific C&D modules.

In the embodiment of the open architecture test system, framework classes are used to enable, activate, control and monitor the modules. A framework is a set of classes and methods that implement common test-related operations. This includes classes for calibration and/or diagnostics, power supply, pin electronics sequencing, setting current/voltage levels, setting timing conditions, obtaining measurements, controlling test flow, etc. The framework also provides methods for runtime services and debugging. In one approach, framework objects are used to implement standard interfaces. A C++ based reference implementation of the framework classes is provided to implement standard interfaces of the framework objects. The test system further supports user specific framework objects.

The open architecture tester system uses a minimum set of interfaces at the system framework level. The C&D framework is designed to operate on objects that present generic and universally applicable interfaces. When a third party module vendor integrates its calibration and/or diagnostics software into the system, the vendor needs to provide new components supporting the same interfaces of the system as those interfaces supported by existing components. Such standard interfaces of an embodiment of the invention allow for seamless integration of vendor-supplied modules into the system in a plug-and-play manner.

In one embodiment, Standard Interfaces to the system TOS are defined as pure abstract C++ classes. Vendor-supplied module-specific calibration and/or diagnostics classes are provided in the form of executables, such as dynamic link libraries (DLLs), which may be independently and dynamically (on demand) loaded by the system software at runtime. Each such software module is responsible for providing vendor-specific implementations for the system calibration and/or diagnostics interface commands, which comprise the application programming interface (API) for calibration and diagnostic software development.

The requirement for performing calibration and/or diagnostics varies widely across modules of different types, as well as across modules of the same type from different vendors. The C&D framework's interface classes are designed to address such a wide variety of situations. Since the nature of the calibration and/or diagnostics modules and routines are widely variable, vendors provide information about their test modules in a standard way. Thus, the actual calibration and/or diagnostics routines are located in modules exposing standards, abstract interfaces, backed by implementations specific to that module type. In addition, there is a facility for invoking non-well-known interfaces in order to support vendor-specific calibration and/or diagnostics capabilities.

Standard Calibration and Diagnostic Interfaces

FIG. 2a illustrates a method for integrating vendor-supplied C&D data using a C&D framework according to an embodiment of the present invention. As shown in FIG. 2a, the C&D framework 200, illustrated as a unified modeling language (UML) class diagram, includes a C&D vendor common information interface 202 (ICDVendCommonInfo) which comprises mechanisms to allow the C&D framework to obtain information about the contents of the calibration and/or diagnostics routine sets. The ICDVendCommonInfo interface 202 includes a number of routines and component modules, as well as the names and identifiers (IDs) of methods with non-standard interfaces. In one approach, the ICDVendCommonInfo interface includes the following list of methods: getvendorInfo( ), getModuleInfo( ), getDLLRev( ), getLevelAndCategory( ), getGroups( ), getThirdPartyAccess( ), getSwModules( ), and runSwModules( ).

The getVendorInfo( ) method reads the vendor name of the hardware module that the DLL corresponds to. This vendor name string is intended to describe the name of the vendor, as related to its module ID. For example, if the hardware module is ADVANTEST's DM250MHz module, then the string could be something like "ADVANTEST". The vendor name returned contains numeric and alphabetical characters ('a'–'z', 'A'–'Z', '0–9').

The getModuleInfo( ) method reads the module name of the hardware module that the DLL corresponds to. This module name string is intended to describe the name of the hardware module, as related to its module ID. For example, if the hardware module is ADVANTEST's DM250MHz module, then the string could be something like "DM250MHz". The module name returned contains numeric and alphabetical characters ('a'–'z', 'A'–'Z', '0–9').

The getDLLRev( ) method reads the revision of this DLL in string. This interface is also used during the installation.

The getLevelandCategory( ) method reads the supported levels and categories from the vendor module. According to the returned levels and categories, the framework will query the supported program groups using the method getGroups( ).

The getGroup( ) method returns the program groups belong to the specified program level and category. The specified program level and category are the ones returned through the method getLevelAndCategory( ).

The getThirdPartyAccess( ) method gets information about a Third Party Access (TPA) method for the whole calibration and diagnostic module. By using this, the vendor module may plug in a vendor specific property displayed on a Calibration and Diagnostics GUI tool. If the vendor C&D module does not need to have this interface, then a null pointer is returned from this method.

The getSwModules( ) method sets the detailed calibration or diagnostic program name to the framework. If the module has a set of programs that belong to the specified level and the category and group, the implementation of this method has to return the set of program information to the framework through a program information method. The level, category, group are used to classify the programs in the GUI tool. Since it doesn't create a scope for the program names, the program identifier (progID) may be unique in a particular calibration or diagnostics software module.

The runSwModules( ) method asks the module to execute a selected program. One program may be selected at a call. The framework has the sequence of the programs selected by the user in GUI tool, and it calls this method through the responsible modules. The user may select the hardware entity (a channel, in general) to run the program. This information is passed through a parameter env. Each program code needs to run on the selected hardware entity.

The UML diagram of FIG. 2a also includes a module configuration data 204, a module manager 206, a system control C&D framework 208, a site controller C&D framework 210, a system controller 212, a site controller 214 and a C&D GUI tool 216. The UML diagram further includes a vendor calibration common information object 218 which retrieves information from a vendor calibration DLL object 220; and a vendor diagnostic common information object 222 which retrieves information from a vendor diagnostic DLL object 224.

The test system is configured by the module configuration data 204. The module manager 206 manages vendor-supplied driver software, calibration software, and diagnostic software. The C&D framework retrieves the vendor calibration and diagnostic program information through the ICDVendCommonInfo interface 202 according to the configuration data held in the module manager. Each vendor may implement, in its own specific way, a vendor calibration common information object (VendorCal's CommonInfo) 218 or a vendor diagnostic common information object (VendorDiag's CommonInfo) 222 derived for its calibration or diagnostics functionalities respectively.

The C&D framework passes the vendor C&D software information to a C&D graphical user interface (GUI) tool 216 running on the system controller 212. When a user operates the C&D system through this C&D GUI tool 216, the user may choose from the set of C&D programs retrieved from all vendor C&D software loaded in the current system configuration. The C&D framework 208 in the system controller distributes the selected program(s) to the responsible site controllers 214, and then the C&D framework 210 in the site controller executes the programs on the appropriate vendor C&D modules, using the ICDVendCommonInfo interface 202. Thus, by using the ICDVendCommonInfo interface 202, the C&D framework provides vendors a set of standard interfaces for integrating vendor-supplied C&D modules into the test system.

In addition to the ICDVendCommonInfo interface 202, the C&D framework further includes the following interfaces:

ICDVendFwCtrl

This interface provides a framework supported utility used by vendor components to access C&D framework environment settings required for the execution of the vendor program. This includes algorithm versions, calibration data revision settings, etc.

ICDVendIO

This interface provides a framework supported utility used by vendor components to produce standardized messages to be directed to the C&D GUI tool, or other applications running on the System Controller, as well as providing for datalogging services.

ICDProgress

This interface provides a framework supported utility used by vendor components to transmit the status of vendor program execution (e.g., "percentage complete" information, etc.). This interface is also used to halt C&D execution flow invoked from C&D GUI tool or to pause or resume execution.

ICDVendCalData

This interface provides a framework supported utility used by vendor components to read and write system files such as calibration data, etc.

SysDeviceSiteMgr

The system device site manager (ISysDeviceSiteMgr) interface provides a framework supported utility used by vendor components to access shared system devices or instruments. For example, it provides access to the instruments on the System Controller, connected through a GPIB bus, or by RS-232C. Proxy objects, such as IGPIB-DeviceProxy and IRS232Proxy, are provided. These give the vendor modules remote access to the devices or instruments installed on the System Controller. FIG. 2b illustrates the scheme used by the test system for accessing shared instrument according to an embodiment of the present invention.

Runtime Calibration

Runtime calibration is a set of calibration activities that may be invoked from test classes or from the C&D framework while the system is loading or executing a test plan program. In one embodiment, the method of performing runtime calibration includes:

Ascertaining Hardware Module Status:

The TOS determines whether all modules have been calibrated and are ready to test the DUT.

Loading Calibration Data (Stored During a Previous Calibration Operation):

The TOS initializes the modules by loading module-specific calibration data.

Time Domain Reflection (TDR) and Timing Calibration Data Compensation:

A user may compensate module-specific timing calibration data, which is used with a particular performance board (or loadboard). Note that the system timing calibration does not take into account the propagation delays of the trace lines on the particular performance board chosen by the user at device test time, as a performance board is designed for a particular DUT type. Since there is non-zero delays on the lines from the tester module channels to the DUT pins, the timing calibration data needs to be compensated with regard to the length of the trace lines on the performance board. Time Domain Reflection (TDR) is a method used to measure the length of trace lines using electric reflection, and the measured data is then used to compensate the timing calibration data. Also note that since the timing calibration data is specific to each vendor-supplied module, the data compensation process becomes specific to the vendor-supplied module.

Online Timing Calibration Data Compensation:

The TOS and user are able to compensate module-specific timing calibration data with regard to changes dictated by conditions occurred during test execution, performance board effects, and other factors. In other words, the timing calibration data often needs to be compensated according to the actual conditions of the test.

In one embodiment, FIG. 3a illustrates a digital function generator module that calibrates its driver timings to assure that the specified timing is generated at a 50% point 302 of Vih (high driver voltage) 304 and Vil (low driver voltage) 306.

The digital function generator module has two online calibration parameters, Vih 304 and Vil 306, which are used to specify the 50% point of the driver voltage amplitude. The base timing calibration data is obtained with a set of predefined voltage amplitudes. For example, with Vih=3V and Vil=0V, a 50% point of Vih and Vil is at 1.5V. The Vih and Vil values are used to compensate this timing calibration data for the driver timing during device test execution. As shown in FIG. 3b, if the driver of a pin (or pin group) is programmed to have Vih=1.0V (308) and Vil=0V (310) during a test, the 50% point 312 of this driver amplitude is 0.5V. Online calibration is employed to use the specified Vih and Vil values to compensate the timing calibration data so that it is adequate for these operative driver voltages.

In an open architecture test system, the hardware resource representation used in the test plan program language is vendor independent. For example, a user is allowed to declare a pin group not only with individual pins provided by a particular vendor, but also with pins provided by other vendors, as long as such pins satisfy certain system requirement (if any). Since a test class uses the hardware representation specified in a test plan program, it supports this type of vendor independent (i.e., logical) hardware representation. Even if the vendor-specific runtime calibration implementations are exposed by the system through an interface, for example through an interface class ICDVendRtCal, the actual implementations may be different. Thus, each vendor-specific runtime calibration component has a different access handle for its functionality. A test class developer (i.e., the user) needs to obtain vendor-specific access handles associated with the same logical hardware representation separately, and processes each access handle separately (each of which is responsible for the particular vendor-specific hardware resources extracted from the same logical hardware representation). In order to avoid this complexity during test class development, the C&D framework hides this complexity, and provides a proxy implementation with the ICDRuntimeCal interface.

FIG. 4 is a UML class diagram that illustrates the integration of vendor-specific calibration information into an open architecture tester framework during runtime according to an embodiment of the present invention. The UML diagram includes a C&D vendor runtime calibration (ICDVendRtCal) interface 402, a C&D runtime calibration (ICDRuntimeCal) interface 404 and a C&D runtime system (ICDRuntimeSys) interface 406. The ICDVendRtCal interface 402 contains mechanisms to allow the framework to obtain the particular implementation of a vendor-specific runtime calibration routine set. The ICDRuntimeCal interface 404 allows users to access different vendor-specific implementations of the ICDVendRtCal runtime calibration interface 402. The UML diagram of FIG. 4 further includes a site controller 214, a site controller C&D framework 210, a vendor runtime calibration class 408, a runtime calibration class 410 and a test class 412.

In one embodiment, the ICDVendRtCal interface 402, ICDRuntimeCal interface 404, and ICDRuntimeSys interface 406 include one or more of the following methods: getSwModule( ), getAlgRev( ), isInitialized( ), loadDCCalData( ), loadACCalData( ), getAttributeCache( ), tdrCal( ), getTdrCalDataFromFile( ), putTdrCalDataToFile( ), mergeCal( ), and loadACCalData( ).

The getAlgRev( ) method returns the algorithms or the data type name the test module supports. The C&D framework requests the default revision and the supported revisions via the getAlgRev( ) method. The revision selection is made by the user on the C&D GUI tool. The framework provides a utility for the vendor module in order to read the selected revision. The test module uses the selected revision to support bundle capabilities.

The isInitialized( ) method is called by the C&D framework to determine whether the test modules are initialized.

The loadDCCalData( ) method is called when the DC calibration data needs to be loaded onto the hardware modules in order to be ready to be operated. The framework queries the modules that they're ready or not by calling isInitialized( ) method on the vendor modules, and call this function on demand to load the DC calibration object for the particular module. The vendor modules obtain the algorithm revision that the user wants to use. The functionalities for this activity are provided by the C&D framework.

The loadACCalData( ) method is called when The AC calibration data needs to be loaded onto the hardware modules in order to be ready to be operated. The framework requests the modules that they're ready or not by calling isInitialized( ) method on the vendor modules, and call this function on demand to load the AC calibration for the particular module. The vendor modules obtain the algorithm revision that the user wants to use. The functionalities for this activity are provided by the C&D framework. The standard AC calibration data is the calibration data measured for the default condition. This default condition is decided by vendor hardware module. For example, ADVANTEST DM250MHz module measures the standard AC calibration data with 0v–3v driver voltage swing.

The method getAttributeCache( ) method obtains an ICD-CalAttributeCache object. ICDCalAttributeCache is a vendor module specific interpreter of the parameter-value pairs described in calibration block in the Oasis Test Program Language (OTPL). The calibration block describes the condition for the online calibration condition. Each vendor hardware module needs to have different set of parameters as the online calibration condition.

These online calibration parameters are listed in the resource file. If the resource type supported by any particular module has the online calibration parameters, it needs to be listed in the correspondent resource file. The resource files are read by the system and used to determine what calibration module is responsible to accept the parameters specified in the calibration block.

ICDCalAttributeCache is the interface to provide the methods to set the vendor hardware module specific online calibration parameters and also to write it to the hardware module. The calibration module developers implement this interface which returns an instance for a particular resource type through getAttributeCache( ), if the hardware module requires the calibration data compensation according to the condition in which user uses this particular module. The framework passes the online calibration parameters to this instance, and call apply( ) method to write it to the hardware module. The parameters are stored in Test Condition Memory (TCM) and the framework will give an ID for a set of ICDCalAttributeCache objects that realize a test condition.

The tdrCal( ) method measures the length of the cable on the particular channel by using Time Domain Reflection (TDR) method in order to compensate the calibration data. This method is implemented for the hardware modules that require this functionality.

The getTdrCalDataFromFile( ) method reads the TDR data file, which is created by tdrCal( ) method. The vendor implementation needs to read the TDR data file for the performance board identifier. This method reads the TDR data of the pins in the data file.

The putTdrCalDataToFile( ) method writes the TDR data file. This method is used by a user who wants to create TDR data file from other user oriented data file, or who wants to compensate TDR data measured by tdrCal( ).

The mergeCal( ) method compensates the standard AC calibration data with the TDR result data. The standard AC calibration or the arbitrary calibration data needs to be loaded before calling this method.

The loadACCalData( ) method is called when the user tries to load the standard AC calibration or the arbitrary AC calibration or the merged AC calibration data from the data file. When the destination is the Test Condition Memory, the block identifier is specified to TcmID. The created Test Condition Memory block would be selected by selectTestCondition( ) method. The specified TcmID may be used by the system to revert the calibration data back from the online calibration data to the original calibration data loaded by this method at test execution time. If the user does not use this method to load the data onto the Test Condition Memory, the system calls selectTestCondition( ) on the vendor module with the unknown TcmID. The vendor module returns an error in this situation.

Use of Test Condition Memory

Runtime calibration activities may be performed during test plan program execution. For example, online calibration may be done every time after any condition that may cause a loss of the system accuracy is detected. This online calibration causes an overhead for test execution time, and which in turn may reduce the productivity of the test system.

In order to alleviate this overhead, according to another embodiment of the present invention, the test system pre-loads a set of predefined calibration data, and stores it in a test condition memory. The test condition memory (TCM) is a condition data cache for storing test conditions, and it can effectively transfer a test condition data from the TCM to hardware registers. This test condition memory may be implemented by either software or hardware. The C&D framework will create, select, delete test conditions using a ITCMManipulator interface that has the following methods implemented by vendor calibration modules.

OFCStatus openTCMEntry(TCMID_t condition);
OFCStatus closeTCMEntry(TCMID_t condition);
OFCStatus selectTCMEntry(TCMID_t condition);
OFCStatus removeTCMEntry(TCMID_t condition);

TCMID_t is an identifier of a Test Condition. The framework will specify an identifier for creation (openTestCondition( ) and closeTestCondition( )), selection (selectTestCondition( )), deletion (removeTestCondition( )) of a Test Condition. The TCMManipulator is returned by the ICDVendRtCal::getTCMManipulator( ).

During test plan program execution time, the C&D framework selects the appropriate test condition memory blocks, and transfers them to the corresponding hardware module registers. FIG. 5 illustrates a method for implement a test condition memory according to an embodiment of the present invention. The method includes a test condition memory manipulator interface (ITCMManipulator) 502, a C&D vendor runtime calibration interface 402, and a vendor runtime calibration data object 408. The ITCMManipulator interface 502 is used by the C&D framework to manipulate the test condition memory. By implementing this interface, any vendor's test condition data can be integrated and loaded into the TCM seamlessly, thereby reducing the calibration overhead of the test system.

There are several benefits achieved by the disclosed C&D framework. First, it enables multi-vendor (i.e., third party) software and instruments to be developed, certified individually, and integrated reliably into the test system, while not requiring any vendor-specific, proprietary treatment for calibration and/or diagnostics of the instruments. In addition, the disclosed C&D framework organizes vendor-supplied calibration and/or diagnostics modules into separate components, thereby providing seamless support for integration and use of a particular vendor-supplied component. Moreover, the disclosed C&D framework provides a remote access scheme for sharing system instruments by module C&D components. Furthermore, the C&D framework provides mechanisms for storing calibration data in a test condition memory, which reduces test program runtime overhead typically incurred during testing due to re-calibrations of the test system.

One skilled in the relevant art will recognize that many possible modifications and combinations of the disclosed embodiments may be used, while still employing the same basic underlying mechanisms and methodologies. The foregoing description, for purpose of explanation, has been described with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and its practical applications, and to enable others skilled in the art to best utilize the invention and various embodiments with various modifications as are suited to the particular use contemplated.

What is claimed is:

1. A method for integrating test modules in a modular test system, comprising:
   creating component categories for integrating vendor-supplied test modules;
   creating a calibration and diagnostics (C&D) framework for establishing a standard interface between the vendor-supplied test modules and the modular test system, wherein the C&D framework comprises interface classes communicating vendor-supplied module integration information;
   receiving a vendor-supplied test module;
   retrieving module integration information from the vendor-supplied test module in accordance with the component categories; and
   integrating the vendor-supplied test module into the modular test system based on the module integration information using the C&D framework.

2. The method of claim 1, further comprising:
   storing the module integration information in a test condition memory; and
   performing calibration of the vendor-supplied test module based on the module integration information stored in the test condition memory.

3. The method of claim 2, wherein performing calibration comprises:
   providing a runtime calibration interface; and
   performing runtime calibration of the vendor-supplied test module based on the runtime calibration interface.

4. The method of claim 3, wherein the runtime calibration interface comprises:
   a system interface for communicating with the vendor-supplied test module via a site controller;
   a calibration interface for communicating test class information with a user; and
   a vendor interface for communicating vendor-supplied calibration information with a vendor.

5. The method of claim 3, wherein performing runtime calibration comprises:
   obtaining hardware module status; loading calibration data;
   performing time domain reflection; performing timing calibration data compensation; and
   performing online timing calibration data compensation.

6. The method of claim 1, wherein the component categories comprise one or more elements selected from the group consisting of driver software, calibration software, and diagnostic software.

7. The method of claim 1, wherein the interface classes comprise;
   a module manager for obtaining module configuration data;
   a vendor command information interface for obtaining a vendor calibration DLL and a vendor diagnostic DLL;
   a site controller framework for interfacing with one or more site controllers; and
   a system framework for interfacing with a system controller.

8. The method of claim 1, wherein the interface classes are defined as C++ classes.

9. The method of claim 1, further comprising:
   storing the module integration information in a test condition memory; and
   performing diagnostics on the vendor-supplied test module based on the module integration information stored in the test condition memory.

10. The method of claim 1, wherein retrieving comprises loading the module integration information dynamically during runtime.

11. The method of claim 1, wherein retrieving comprises loading the module integration information independently during runtime.

12. The method of claim 1, wherein integrating comprises calibrating the vendor-supplied test module based on the module integration information.

13. The method of claim 1, wherein integrating comprises diagnosing the vendor-supplied test module based on the module integration information.

14. A modular test system, comprising:
   a system controller;
   at least one site controller coupled to the system controller;
   at least one vendor-supplied test module and its corresponding device under test (DUT);
   component categories for integrating vendor-supplied test modules;
   a calibration and diagnostics (C&D) framework for establishing a standard interface between the vendor-supplied test modules and the modular test system, wherein the C&D framework comprises interface classes communicating vendor-supplied module integration information;
   means for receiving a vendor-supplied test module;
   means for retrieving module integration information from the vendor-supplied test module in accordance with the component categories; and
   means for integrating the vendor-supplied test module into the modular test system based on the module integration information using the C&D framework.

15. The system of claim 14, further comprising;
   a test condition memory for storing the module integration information; and means for performing calibration of the vendor-supplied test module based on the module integration information stored in the test condition memory.

16. The system of claim 15, wherein the means for performing calibration comprise:
a runtime calibration interface; and
means for performing runtime calibration of the vendor-supplied test module based on the runtime calibration interface.

17. The system of claim 16, wherein the runtime calibration interface comprises:
a system interface for communicating with the vendor-supplied test module via a site controller;
a calibration interface for communicating test class information with a user; and
a vendor interface for communicating vendor-supplied calibration information with a vendor.

18. The system of claim 16, wherein the means for performing runtime calibration comprise:
means for obtaining hardware module status;
means for loading calibration data;
means for performing time domain reflection;
means for performing timing calibration data compensation; and
means for performing online timing calibration data compensation.

19. The system of claim 14, wherein the component categories comprise: driver software; calibration software; and diagnostic software.

20. The system of claim 14, wherein the interface classes comprise:
a module manager for obtaining module configuration data;
a vendor command information interface for obtaining a vendor calibration DLL and a vendor diagnostic DLL;
a site controller framework for interfacing with one or more site controllers; and
a system framework for interfacing with a system controller.

21. The system of claim 14, wherein the interface classes are defined as C++ classes.

22. The system of claim 14, further comprising:
a test condition memory for storing the module integration information; and
means for performing diagnostics on the vendor-supplied test module based on the module integration information stored in the test condition memory.

23. The system of claim 14, wherein the means for retrieving comprise means for loading the module integration information dynamically during runtime.

24. The system of claim 14, wherein the means for retrieving comprise means for loading the module integration information independently during runtime.

25. The system of claim 14, wherein means for integrating comprise means for calibrating the vendor-supplied test module based on the module integration information.

26. The system of claim 14, wherein means for integrating comprise means for diagnosing the vendor-supplied test module based on the module integration information.

* * * * *